(12) United States Patent
Mueller-Mach et al.

(10) Patent No.: US 7,902,564 B2
(45) Date of Patent: Mar. 8, 2011

(54) MULTI-GRAIN LUMINESCENT CERAMICS FOR LIGHT EMITTING DEVICES

(75) Inventors: Regina B. Mueller-Mach, San Jose, CA (US); Gerd O. Mueller, San Jose, CA (US); Michael R. Krames, Los Altos, CA (US); Peter J. Schmidt, Aachen (DE); Hans-Helmut Bechtel, Aachen (DE)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 978 days.

(21) Appl. No.: 11/615,372

(22) Filed: Dec. 22, 2006

(65) Prior Publication Data

US 2008/0149956 A1    Jun. 26, 2008

(51) Int. Cl.
*H01L 33/00* (2010.01)
(52) U.S. Cl. ............... 257/98; 257/79; 257/80; 257/102; 257/E31.002; 257/E31.093; 257/E31.095; 257/E33.096; 257/E31.129; 250/493.1; 250/505.1; 250/909; 252/301.16; 252/301.36; 252/301.4 R; 313/483; 313/485; 313/486; 313/502; 313/503; 313/504
(58) Field of Classification Search .......... 257/79, 257/80, 98, 102, E33.061, E31.002, E31.093, 257/E31.095, E31.096, E31.129; 250/493.1, 250/505.1, 909; 252/301.16–301.4 H; 313/483, 313/485, 486, 502–504

See application file for complete search history.

(56) References Cited

U.S. PATENT DOCUMENTS

| | | | |
|---|---|---|---|
| 5,744,815 | A | 4/1998 | Gurevich et al. |
| 6,274,924 | B1 | 8/2001 | Carey et al. |
| 6,335,548 | B1 | 1/2002 | Roberts et al. |
| 6,351,069 | B1 | 2/2002 | Lowery et al. |
| 6,409,938 | B1 | 6/2002 | Comanzo |
| 6,501,100 | B1 | 12/2002 | Srivastava et al. |
| 6,576,488 | B2 | 6/2003 | Collins, III et al. |
| 6,630,691 | B1 | 10/2003 | Mueller-Mach et al. |
| 6,642,618 | B2 | 11/2003 | Yagi et al. |
| 6,650,044 | B1 | 11/2003 | Lowery |
| 6,696,703 | B2 | 2/2004 | Mueller-Mach et al. |
| 7,022,262 | B2 * | 4/2006 | Lee et al. ............... 252/301.4 R |
| 7,053,419 | B1 | 5/2006 | Camras et al. |
| 7,064,355 | B2 | 6/2006 | Camras et al. |

(Continued)

FOREIGN PATENT DOCUMENTS

DE    10349038 A1    5/2004

(Continued)

OTHER PUBLICATIONS

Merriam-Webster OnLine definition of Ceramic as noun and adjective.*

(Continued)

*Primary Examiner* — Hrayr A. Sayadian (57) ABSTRACT

A ceramic body is disposed in a path of light emitted by a light source. The light source may include a semiconductor structure comprising a light emitting region disposed between an n-type region and a p-type region. The ceramic body includes a plurality of first grains configured to absorb light emitted by the light source and emit light of a different wavelength, and a plurality of second grains. For example, the first grains may be grains of luminescent material and the second grains may be grains of a luminescent material host matrix without activating dopant.

18 Claims, 3 Drawing Sheets

U.S. PATENT DOCUMENTS

| | | |
|---|---|---|
| 7,341,878 B2 | 3/2008 | Krames et al. |
| 7,514,721 B2 | 4/2009 | Krames et al. |
| 7,544,310 B2 * | 6/2009 | Hirosaki ................ 252/301.4 F |
| 7,768,754 B2 * | 8/2010 | Collins et al. .................... 361/56 |
| 2003/0213960 A1 * | 11/2003 | Kitagawa et al. ............... 257/71 |
| 2004/0007961 A1 | 1/2004 | Srivastava et al. |
| 2004/0124429 A1 | 7/2004 | Stokes et al. |
| 2004/0145308 A1 * | 7/2004 | Rossner et al. ............... 313/512 |
| 2004/0164311 A1 | 8/2004 | Uemura |
| 2005/0133808 A1 | 6/2005 | Uraya et al. |
| 2005/0269582 A1 * | 12/2005 | Mueller et al. .................. 257/94 |
| 2005/0276995 A1 | 12/2005 | Kondo et al. |
| 2006/0202105 A1 | 9/2006 | Krames et al. |
| 2007/0108896 A1 * | 5/2007 | Hirosaki ....................... 313/506 |
| 2008/0149957 A1 * | 6/2008 | Kameshima et al. ........... 257/98 |
| 2010/0127286 A1 * | 5/2010 | Schmidt et al. ................. 257/98 |

FOREIGN PATENT DOCUMENTS

| | | |
|---|---|---|
| WO | 2005071039 A1 | 8/2005 |
| WO | 2006111907 A2 | 10/2006 |

OTHER PUBLICATIONS

Michael R Krames et al., "Multi-Grain Luminescent Ceramics for Light Emitting Deviices." U.S. Appl. No. 11/290,299, filed Nov. 29, 2005, 26 pages.

English translation of German Patent Application No. DE 10349038A1, 9 pages.

* cited by examiner

MULTI-GRAIN LUMINESCENT CERAMICS FOR LIGHT EMITTING DEVICES

BACKGROUND

1. Field of Invention

The present invention relates to wavelength-converted semiconductor light emitting devices.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n-and p-type regions.

Since the light emitted by current commercially available III-nitride devices is generally on the shorter wavelength end of the visible spectrum, the light generated by III-nitride devices can be readily converted to produce light having a longer wavelength. It is well known in the art that light having a first peak wavelength (the "primary light") can be converted into light having a longer peak wavelength (the "secondary light") using a process known as luminescence/fluorescence. The fluorescent process involves absorbing the primary light by a wavelength-converting material such as a phosphor and exciting the luminescent centers of the phosphor material, which emit the secondary light. The peak wavelength of the secondary light will depend on the phosphor material. The type of phosphor material can be chosen to yield secondary light having a particular peak wavelength.

Figure 1:
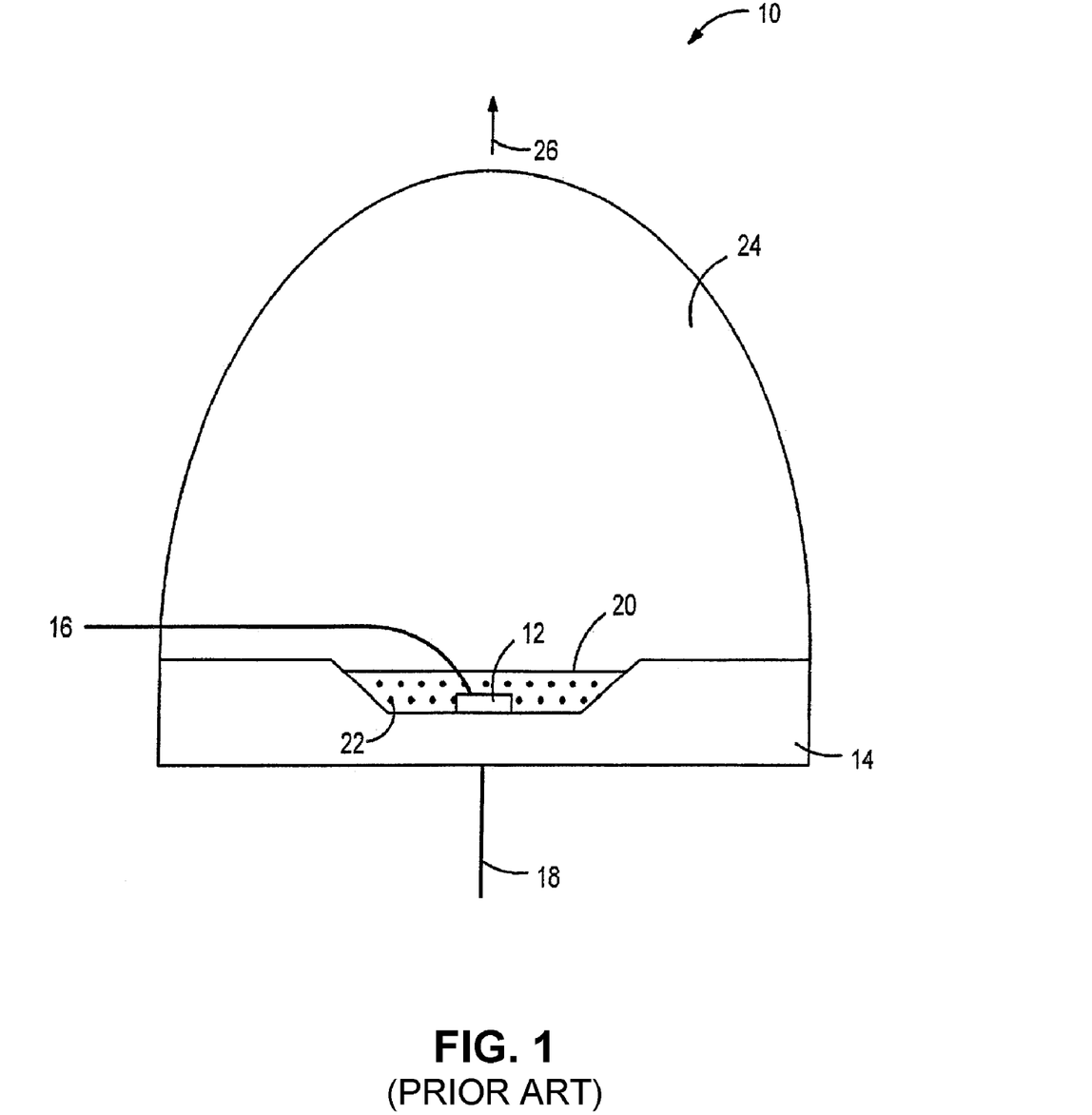
FIG. 1 is a cross sectional view of a prior art phosphor-converted LED.

FIG. 1 illustrates a prior art phosphor-converted LED 10 described in U.S. Pat. No. 6,351,069. The LED 10 includes a III-nitride die 12 that generates blue primary light when activated. The III-nitride die 12 is positioned on a reflector cup lead frame 14 and is electrically coupled to leads 16 and 18. The leads 16 and 18 conduct electrical power to the III-nitride die 12. The III-nitride die 12 is covered by a layer 20, often a transparent resin, which includes wavelength-converting material 22. The type of wavelength-converting material utilized to form the layer 20 can vary, depending upon the desired spectral distribution of the secondary light that will be generated by the fluorescent material 22. The III-nitride die 12 and the fluorescent layer 20 are encapsulated by a lens 24. The lens 24 is typically made of a transparent epoxy or silicone.

In operation, electrical power is supplied to the III-nitride die 12 to activate the die. When activated, die 12 emits the primary light away from the top surface of the die. A portion of the emitted primary light is absorbed by the wavelength-converting material 22 in the layer 20. The wavelength-converting material 22 then emits secondary light, i.e., the converted light having a longer peak wavelength, in response to absorption of the primary light. The remaining unabsorbed portion of the emitted primary light is transmitted through the wavelength-converting layer, along with the secondary light. The lens 24 directs the unabsorbed primary light and the secondary light in a general direction indicated by arrow 26 as output light. Thus, the output light is a composite light that is composed of the primary light emitted from die 12 and the secondary light emitted from the wavelength-converting layer 20. The wavelength-converting material may also be configured such that very little or none of the primary light escapes the device, as in the case of a die that emits UV primary light combined with one or more wavelength-converting materials that emit visible secondary light.

As III-nitride LEDs are operated at higher power and higher temperature, the transparency of the organic encapsulants used in layer 20 tends to degrade, undesirably reducing the light extraction efficiency of the device and potentially altering the appearance of the light emitted from the device.

Several alternative configurations of wavelength-converting materials have been proposed, such as growth of LED devices on single crystal luminescent substrates as described in U.S. Pat. No. 6,630,691, thin film phosphor layers as described in U.S. Pat. No. 6,696,703, and conformal layers deposited by electrophoretic deposition as described in U.S. Pat. No. 6,576,488 or by stenciling as described in U.S. Pat. No. 6,650,044. Each of these alternative configurations also has disadvantages. Phosphor layers that include binding materials, such as phosphors deposited by electrophoretic deposition or stenciling, may suffer from the same degradation in transparency of the binder materials as described above in reference to FIG. 1. Thin film or conformal phosphor layers can be difficult to handle because the phosphor layers tend to be fragile.

An alternative to phosphors including binder materials and fragile phosphor layers is the use of wavelength converting materials formed into ceramic slabs, as described in more detail in U.S. patent application Publication 2005-0269582, which is incorporated herein by reference. The luminescent ceramic slabs described therein are generally self-supporting layers formed separately from the semiconductor device, then attached to the finished semiconductor device or used as a growth substrate for the semiconductor device. Since luminescent ceramics generally require no binder material besides the ceramic itself and may be more robust than thin film or conformal phosphor layers, luminescent ceramics may avoid at least some of the problems of prior art phosphor layers.

SUMMARY

In accordance with embodiments of the invention, a ceramic body is disposed in a path of a light source. The light source may include a semiconductor structure comprising a light emitting region disposed between an n-type region and a p-type region. The ceramic body includes a plurality of first grains configured to absorb light emitted by the light source and emit light of a different wavelength, and a plurality of second grains. For example, the first grains may be a luminescent material activated with a dopant and the second grains may be grains of a host matrix without activating dopant. Such multi-grain luminescent ceramics may provide improved control over the amount of luminescent grains in the luminescent ceramic, as well as other properties of the luminescent ceramic.

DETAILED DESCRIPTION

Luminescent ceramic layers may be made by sintering a conventional powder phosphor into a ceramic slab. Since the powder phosphor starting material is generally of uniform composition and doping, the resulting luminescent ceramic is generally translucent or transparent and uniformly doped throughout the ceramic slab with activating dopants that act as luminescent centers. One problem with uniformly doped luminescent ceramics is that the minimum thickness of the luminescent ceramic is limited by the ability to reproducibly manufacture the ceramic. Many phosphors have a preferred doping range where the phosphor absorbs and emits light efficiently. In other phosphor arrangements such as conformal layers, phosphor powder with the preferred doping level is deposited to whatever thickness is necessary to achieve the desired amount of luminescent centers, which produces the desired amount of phosphor conversion and of leakage of unconverted light from the light emitting diode, resulting in the desired characteristics of the composite light. In a luminescent ceramic, the thickness required for manufacturability may force the use of a much lower doping level than the preferred level, if the use of the preferred doping level phosphor powder in a ceramic at the minimum thickness required for manufacturability results in too many luminescent centers, and therefore too much phosphor conversion.

For example, a light emitting diode that emits blue light may be combined with a yellow-emitting phosphor and a red-emitting phosphor to make composite light that appears white. Only a small amount of red-emitting phosphor is required; if too much red-emitting phosphor is used, the composite light will appear too red. For example, for a given red phosphor, at the preferred doping level of luminescent centers, the desired red emission may be achieved in a luminescent ceramic layer 20 µm thick. However, the minimum manufacturable thickness of a luminescent ceramic formed from red-emitting phosphor is generally 100 µm. In order to achieve the desired amount of red emission in a luminescent ceramic 100 µm thick, a phosphor powder with a much lower, less desirable doping level must be used to form the luminescent ceramic.

Figure 2:
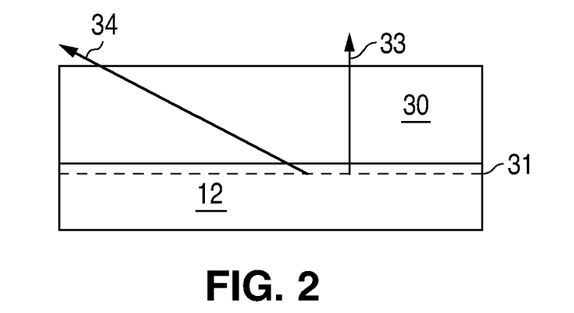
FIG. 2 is a cross sectional view of a transparent luminescent ceramic disposed on a semiconductor light emitting device.

A second problem with transparent luminescent ceramics is illustrated in FIG. 2. A transparent luminescent ceramic 30 is connected to a light emitting device 12. Two light rays 33 and 34 emitted from light emitting region 31 are illustrated. Since light ray 33 is emitted at a smaller angle relative to normal to the surface of the light emitting layer than ray 34, ray 33 "sees" less of the phosphor in luminescent ceramic 30, and is more likely to escape luminescent ceramic 30 without being phosphor-converted. In contrast, ray 34 sees much more of the phosphor in luminescent ceramic 30, and is more likely to be phosphor-converted before escaping luminescent ceramic 30. As a result, assuming that light emitting region 31 emits blue light and the phosphor in luminescent ceramic 30 emits yellow light, light emitted from near the center of the device appears more blue, while light emitted from the edges of the device appears more yellow, resulting in an undesirable yellowish "halo" around a center of more bluish light.

In accordance with embodiments of the invention, a luminescent ceramic is formed from at least two types of grains: luminescent grains doped with activators at the desired level, and undoped grains of any suitable material, often undoped grains of the crystalline host of the luminescent material. During fabrication of the ceramic, dopants may diffuse from the doped luminescent grains into the undoped grains of the crystalline host of the luminescent material, resulting in a ceramic with undoped grains and luminescent grains of varying dopant concentration. Such luminescent ceramics are referred to herein as multi-grain luminescent ceramics. In some embodiments, the luminescent grains have a grain size between 0.2 µm and 20 µm, more preferably between 1 µm and 3 µm or between 5 µm and 15 µm. The undoped grains of the crystalline host of the luminescent material may be the same size as the luminescent grains, though they need not be. The volume percent of luminescent grains in the multi-grain luminescent ceramics depends on the application, and may be between 1% and 30%, often between 5% and 15%. The volume ratio of doped luminescent grains to undoped grains can be selected such that the finished multi-grain luminescent ceramic has the desired number of luminescent centers, and therefore the desired amount of phosphor conversion. Since the total number of luminescent centers in the multi-grain luminescent ceramic can be confined to a fraction of grains, it is not necessary to use low-doped phosphors in order to control the total number of luminescent centers.

Many luminescent grains with various host lattice structures and activator ions may be formed into multi-grain luminescent ceramic layers. For example, aluminum garnet type luminescent materials with the general formula $(Lu_{1-x-y-a-b}Y_xGd_y)_3(Al_{1-z-u}Ga_zSi_u)_5O_{12-u}N_u:Ce_aPr_b$ wherein $0 \leq x \leq 1$, $0 \leq y \leq 1$, $0 < z \leq 0.1$, $0 \leq u \leq 0.2$, $0 < a \leq 0.2$ and $0 < b \leq 0.1$, such as $Lu_3Al_5O_{12}:Ce^{3+}$ and $Y_3Al_5O_{12}:Ce^{3+}$ which emit light in the yellow-green range, may be formed into multi-grain luminescent ceramics by combining doped luminescent grains with undoped $Y_3Al_5O_{12}$ or $Lu_3Al_5O_{12}$ grains. $(Sr_{1-x-y}Ba_xCa_y)_{2-z}Si_{5-a}Al_aN_{8-a}O_a:Eu_z^{2+}$ wherein $0 \leq a < 5$, $0 < x \leq 1$, $0 \leq y \leq 1$, and $0 < z \leq 1$ such as $Sr_2Si_5N_8:Eu^{2+}$, which emit light in the red range, may be formed into multi-grain luminescent ceramics by combining doped luminescent grains with undoped $Sr_2Si_5N_8$ grains. Other green, yellow, and red emitting luminescent materials may also be suitable for forming multi-grain luminescent ceramics, including $(Sr_{1-a-b}Ca_bBa_c)Si_xN_yO_z:Eu_a^{2+}$ wherein a=0.002-0.2, b=0.0-0.25, c=0.0-0.25, x=1.5-2.5, y=1.5-2.5, z=1.5-2.5 including, for example, $SrSi_2N_2O_2:Eu^{2+}$; $(Ca_{1-x-y-z}Sr_xBa_yMg_z)_{1-n}Al_{1+a+b}Si_{1-a-b}N_{3-b}O_b:M_n$ wherein $0 \leq x \leq 1$, $0 \leq y \leq 1$, $0 \leq z \leq 1$, $0 \leq a \leq 1$, $0 \leq b \leq 1$, $0 \leq n \leq 1$, $a \leq n$, and M is a metal selected from the group of Ce, Pr, Nd, Sm, Eu, Gd, Tb, Dy, Ho, Er, Tm, Yb, Lu or mixtures thereof, including, for example, $Ca(Al,Si)_2N_3:Ce,Eu$; $(Sr_{1-u-v-x}Mg_uCa_vBa_x)(Ga_{2-y-z}Al_yIn_zS_4):Eu^{2+}$ including, for example, $SrGa_2S_4:Eu^{2+}$; $(Sr_{1-x}Ba_x)_2SiO_4:Eu$, wherein $0 < x \leq 1$, including, for example, $_4:Eu^{2+}$; and $(Ca_{1-x}Sr_x)S:Eu^{2+}$ wherein $0 < x \leq 1$ including, for example, $CaS:Eu^{2+}$ and $SrS:Eu^{2+}$. The volume ratio of doped luminescent grains to undoped grains can be selected such that the finished multi-grain luminescent ceramic has the desired number of luminescent centers, and therefore the desired amount of luminescence conversion. Since the total number of luminescent centers can be confined to a fraction of grains in the multi-grain luminescent ceramic, it is not necessary to use low-doped grains in order to control the total number of luminescent centers.

In some embodiments, the multi-grain luminescent ceramic includes more than one type of luminescent grain. For example, the multi-grain luminescent ceramic may include a first type of luminescent grain that emits light at a first wavelength, such as yellow or green, and a second type of luminescent grain that emits light at a second wavelength, such as red. In some embodiments, the different types of luminescent grains have the same host matrix but different activating dopants. For example, grains of $CaAlSiN_3$ may be doped with Ce for yellow light and Eu for red light. In one example, 80-99 volume percent of the luminescent grains in a luminescent ceramic are $Ca_{1-x-y}M_yAl_{1+a-b+x}B_bSi_{1-a}N_{3-a}O_a:Ce_x$, where M=(Mg, Sr, Ba), B=(B, Ga), $0.001 \leq x \leq 0.02$, $0 \leq y \leq 1$, $0.0005 \leq a \leq 1$, $0 \leq b \leq 1$, and 1-20 volume percent of the luminescent grains are $Ca_{1-x-y}M_yAl_{1+a-b}B_bSi_{1-a}N_{3-a}O_a:Eu_x$ where M=(Mg, Sr, Ba), B=(B, Ga), $0.001 \leq x \leq 0.02$, $0 \leq y \leq 1$, $0.0005 \leq a \leq 1$, $0 \leq b \leq 1$. In particular, the luminescent ceramic may be 98% $Ca_{0.995}Al_{1.055}Si_{0.945}N_{2.95}O_{0.05}:Ce_{0.005}$ and 2% $Ca_{0.998}Al_{1.05}Si_{0.95}N_{2.95}O_{0.05}:Eu_{0.002}$. In another example, 25-75 volume percent of the luminescent grains in a luminescent ceramic are $(Lu_{1-x-y-a-b}Y_xGd_y)_3(Al_{1-z-u}Ga_zSi_u)_5O_{12-u}N_u:Ce_aPr_b$ wherein $0 \leq x \leq 1$, $0 \leq y \leq 1$, $0 < z \leq 0.1$, $0 \leq u \leq 0.2$, $0 < a \leq 0.2$ and $0 < b \leq 0.1$, such as $Y_{2.985}Al_5O_{12}:Ce_{0.015}$ (u=0), which emits green to yellow light in the wavelength range between 490 and 580 nm, and 25-75 volume percent of the luminescent grains are $(Lu_{1-x-y-a-b}Y_xGd_y)_3(Al_{1-z-u}Ga_zSi_u)_5O_{12-u}N_u:Ce_aPr_b$ wherein $0 \leq x \leq 1$, $0 \leq y \leq 1$, $0 < z \leq 0.1$, $0 \leq u \leq 0.2$, $0 < a \leq 0.2$ and $0 < b \leq 0.1$, such as $Y_{2.97}Al_{4.9}Si_{0.1}O_{11.9}N_{0.1}:Ce_{0.03}$, which emits yellow to red light in the wavelength range between 560 and 640 nm. A multi-grain luminescent ceramic with more than one type of luminescent grain may also include undoped grains, though it need not.

A multi-grain luminescent ceramic may be formed by heating doped powder luminescent material and undoped host material or any other suitable material until the surface of the powder particles begin to form a strong bond or neck at the contact points of the particles. The temperature and pressure under which sintering occurs may depend on the luminescent material used. For example, materials with high dopant diffusion rates may be sintered at lower temperature and higher pressure than materials with lower dopant diffusion rates. During sintering, the partially connected particles form a rigid agglomerate that further decreases its porosity by further neck growth. Grain boundaries are formed and move so that some grains grow at the expense of others. This stage of sintering continues while the pore channels are connected (open porosity) until the pores are isolated (closed porosity). In the last stage of sintering, the pores become closed and are slowly eliminated along grain boundaries until full densification is achieved. After sintering, as described above, a multi-grain luminescent ceramic may have regions of doped material and regions of undoped material. The regions of doped material typically do not have a constant dopant concentration. Rather, these regions generally include an area of high dopant concentration at the center. The concentration of dopant in the doped region drops from the high dopant concentration center to the edge where the doped region meets surrounding undoped material. Depending on the size of the precursor luminescent material grains, the regions of doped material may have a diameter as large as 100 μm.

In the case of a multi-grain luminescent ceramic of $(Lu_{1-x-y-a-b}Y_xGd_y)_3(Al_{1-z-u}Ga_zSi_u)_5O_{12-u}N_u:Ce_aPr_b$ wherein $0 \leq x \leq 1$, $0 \leq y \leq 1$, $0 < z \leq 0.1$, $0 \leq u \leq 0.2$, $0 < a \leq 0.2$ and $0 < b \leq 0.1$, such as $Y_3Al_5O_{12}:Ce^{3+}$, the ceramic may be formed by mixing powdered binary oxides of the constituents of the final $Y_3Al_5O_{12}$ and $Y_3Al_5O_{12}:Ce^{3+}$ materials. The constituents may include $Al_2O_3$, $Y_2O_3$, $Gd_2O_3$, and $CeO_2$. The mixture is stabilized with a binder to form a granulate having a granule size, for example, between 10 and 400 μm in diameter. As described below in several examples, the granules are sintered into a ceramic including doped $Y_3Al_5O_{12}:Ce^{3+}$ grains surrounded by undoped $Y_3Al_5O_{12}$. A granule 200 μm in diameter with a density of about $1g/cm^{-3}$ may form a ceramic region about 40-50 μm in diameter after sintering. The phosphor grains formed from the granules during sintering may have diameter between 2 μm and 20 μm, thus one granule of constituent mixture generally forms multiple grains. In an alternative method described in more detail in an example below, a $Y_3Al_5O_{12}:Ce^{3+}$ multi-grain luminescent ceramic may be formed by sintering already-formed $Y_3Al_5O_{12}:Ce^{3+}$ crystalline grains with non-doped granules of mixing powdered binary oxides of the constituents of the final $Y_3Al_5O_{12}$ material.

The yellow halo problem illustrated in FIG. 2 may be reduced or eliminated by increasing scattering from the luminescent ceramic. Scattering centers may be created by incorporating air pockets during manufacture of the ceramic, for example by reducing the temperature at which the luminescent ceramic is formed.

Some luminescent materials, $Y_3Al_5O_{12}$ in particular, are transparent in ceramic form if the ceramics is fully dense and free of second phases. $Ce^{3+}$ dopants may act as a sintering aid and the doped $Y_3Al_5O_{12}:Ce^{3+}$ grains may not scatter incident light. Thus, doped $Y_3Al_5O_{12}:Ce^{3+}$ grains evenly dispersed in a transparent undoped $Y_3Al_5O_{12}$ matrix may act as non-scattering parts. In such a multi-grain luminescent ceramic, the number of doped $Y_3Al_5O_{12}:Ce^{3+}$ grains may be selected to control scattering to maximize light extraction while reducing or eliminating the yellow halo problem of a uniformly doped luminescent ceramic, described above.

In some luminescent materials, $Y_3Al_5O_{12}$ in particular, the stoichiometry of the material may be adjusted to create material phases that cause scattering. For example, an excess of Al or Y in $Y_3Al_5O_{12}$ may result in a second material phase, which may cause scattering because of a refractive index contrast between the garnet phase and the second phase. In one embodiment, an excess of 5-10 volume percent alumina phase may introduce a desirable amount of scattering without introducing undesirable porosity.

Unlike a conformal phosphor layer or a phosphor layer disposed in a transparent material such as a resin, a multi-grain luminescent ceramic generally has little or no binder material, such as an organic resin or epoxy, present in the final product, other than the luminescent material grains and the undoped grains, and thus avoid the problems of degradation of organic binder materials described above.

Figure 3:
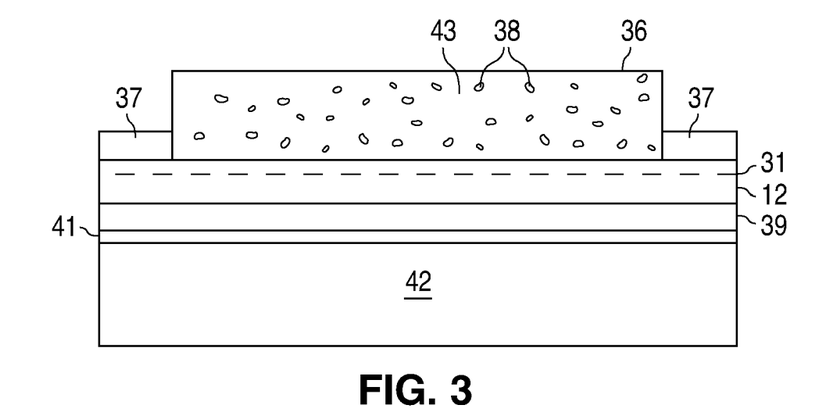
FIG. 3 is a cross sectional view of a multi-grain luminescent ceramic disposed on a thin film semiconductor light emitting device.
Figure 4:
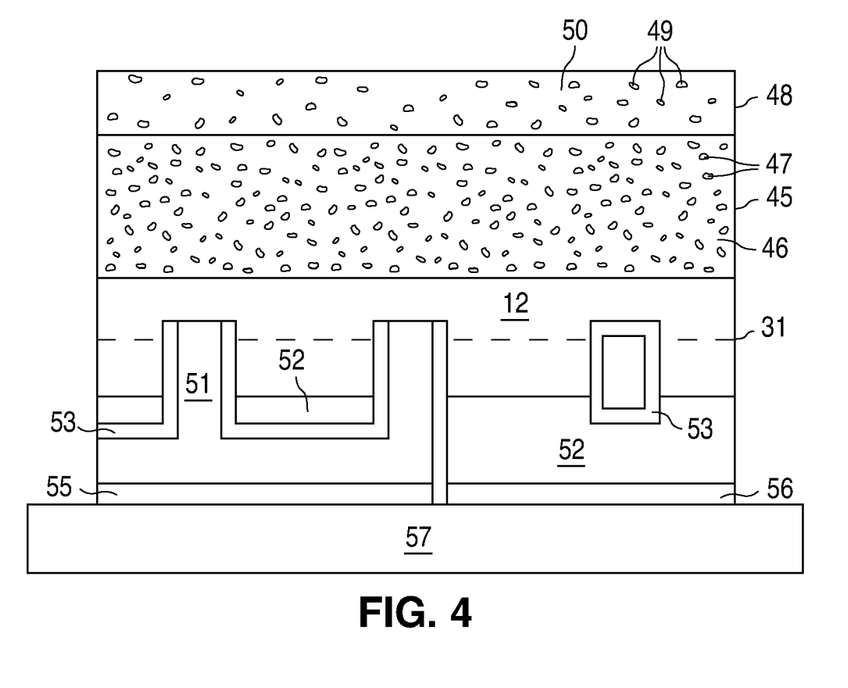
FIG. 4 is a cross sectional view of two multi-grain luminescent ceramics disposed on a flip chip mounted thin film semiconductor light emitting device.

Multi-grain luminescent ceramics may be used with any suitable configuration of light emitter. FIGS. 3 and 4 illustrate multi-grain luminescent ceramics disposed on two types of semiconductor light emitting devices from which the growth substrates have been removed.

FIG. 3 illustrates a multi-grain luminescent ceramic disposed on a semiconductor light emitting device from which the growth substrate has been removed. A semiconductor structure 12 including a light emitting region 31 disposed between an n-type region and a p-type region is electrically and physically connected to a mount 42 via a reflective sheet contact 39, often the p-contact, and one or more bonding layers 41. The growth substrate on which semiconductor structure is grown is removed, exposing a surface of semiconductor structure 12 on which a second contact 37, often the n-contact, and luminescent ceramic 36 are disposed.

Luminescent ceramic 36 includes regions 38 of doped luminescent grains dispersed within a ceramic matrix 43 of undoped grains having the same crystal structure as the luminescent material, or any other suitable undoped matrix compatible to form a ceramic with the doped luminescent grains. For example, luminescent grains 38 may be $Y_3Al_5O_{12}:Ce^{3+}$, which emit light in the yellow-green range, and the undoped matrix 43 may be $Y_3Al_5O_{12}$ Such a $Y_3Al_5O_{12}$ luminescent ceramic 36 may be combined with a semiconductor structure 12 with an active region 31 that emits blue light. Luminescent ceramic 36 converts part of the blue light emitted by active region 31, such that the combination of unconverted blue light and yellow light emitted by the luminescent centers appears white.

FIG. 4 illustrates two multi-grain luminescent ceramics disposed on a flip chip mounted thin film semiconductor light emitting device. In the device of FIG. 4, a conventional semiconductor structure 12 including a light emitting region 31 disposed between an n-type region and a p-type region is grown on a growth substrate. Portions of the semiconductor structure are etched away to reveal portions of the buried conductivity type, generally the n-type region. Contacts 51 of the first conductivity type, generally n-type, are formed in the trenches, and contacts 52 are formed on the remaining portions of the second conductivity type material, generally p-type. Semiconductor structure 12 is connected to a mount 57 via mount connections 55 and 56 of each conductivity type. Contacts 51 and 52 may be electrically isolated from each other by dielectric layers 53, which may be, for example, air or an oxide of silicon. The growth substrate is removed, exposing the top surface of semiconductor structure 12 as illustrated in FIG. 4, on which first and second multi-grain luminescent ceramic layers 45 and 48 are disposed.

First multi-grain luminescent ceramic layer 45 includes luminescent grains 47 dispersed within a matrix of undoped material 46. Luminescent grains 47 may be, for example, $Y_3Al_5O_{12}:Ce^{3+}$, which emit light in the yellow-green range, and undoped grains 46 may be $Y_3Al_5O_{12}$ Second multi-grain luminescent ceramic layer 48 includes luminescent grains 49 disposed within a matrix of undoped material 50. Luminescent grains 49 may be, for example, $CaAlSiN_3:Eu$, which emit light in the red range, and undoped matrix 50 may be $CaAlSiN_3$. Light emitting region 31 of semiconductor structure 12 may emit blue light, for example, such that unconverted light from light emitting region 31 combines with light from multi-grain luminescent ceramic layers 45 and 48 to form white composite light.

Multi-grain luminescent ceramic layers may be attached to the semiconductor structures illustrated in FIGS. 3 and 4 by, for example, wafer bonding, sintering, gluing with thin layers of organic adhesives such as epoxy or silicone, gluing with high index inorganic adhesives, and gluing with sol-gel glasses.

Examples of high index adhesives include high index optical glasses such Schott glass SF59, Schott glass LaSF 3, Schott glass LaSF N18, and mixtures thereof. These glasses are available from Schott Glass Technologies Incorporated, of Duryea, Pa. Examples of other high index adhesives include high index chalcogenide glass, such as (Ge,Sb,Ga)(S, Se) chalcogenide glasses, III-V semiconductors including but not limited to GaP, InGaP, GaAs, and GaN, II-VI semiconductors including but not limited to ZnS, ZnSe, ZnTe, CdS, CdSe, and CdTe, group IV semiconductors and compounds including but not limited to Si and Ge, organic semiconductors, metal oxides including but not limited to tungsten oxide, titanium oxide, nickel oxide, zirconium oxide, indium tin oxide, and chromium oxide, metal fluorides including but not limited to magnesium fluoride and calcium fluoride, metals including but not limited to Zn, In, Mg, and Sn, yttrium aluminum garnet (YAG), phosphide compounds, arsenide compounds, antimonide compounds, nitride compounds, high index organic compounds, and mixtures or alloys thereof. Gluing with high index inorganic adhesives is described in more detail in U.S. Pat. Nos. 7,053,419 and 7,064,355, both of which are incorporated herein by reference.

Gluing with sol-gel glasses is described in more detail in U.S. Pat. No. 6,642,618, which is incorporated herein by reference. In embodiments where the multi-grain luminescent ceramic is attached to the device by a sol-gel glass, one or more materials such as oxides of titanium, cerium, lead, gallium, bismuth, cadmium, zinc, barium, or aluminum may be included in the $SiO_2$ sol-gel glass to increase the index of refraction of the glass in order to more closely match the index of the glass with the indices of the multi-grain luminescent ceramic and the layer of the light emitting device to which the multi-grain luminescent ceramic is attached.

In some embodiments, a multi-grain luminescent ceramic serves as a growth substrate for the semiconductor light emitting device, as described in more detail in U.S. patent application Publication 2005-0269582, in U.S. patent application Ser. No. 11/080,801, titled "Wavelength-Converted Semiconductor Light Emitting Device," and in U.S. application Ser. No. 11/290,299, titled "Luminescent Ceramic Element For A Light Emitting Device," each of which is incorporated herein by reference.

In some embodiments, more than one type of luminescent grain can be included in a multi-grain luminescent ceramic. In some embodiments, the luminescent grains in the multi-grain luminescent ceramic are not evenly dispersed. For example, luminescent grains may be concentrated in the portion of the multi-grain luminescent ceramic closest to the surface of the semiconductor structure. As the distance from the semiconductor surface increases, the concentration of luminescent grains may decrease. The grading profile of luminescent grains may take any shape including, for example, a linear, step-graded, or power law profile, and may include multiple or no regions of constant luminescent grain concentration. In addition, in some embodiments it may be advantageous to reverse the grading profile, such that the region closest to the semiconductor surface has a small luminescent grain concentration that increases as the distance from the device surface increases.

In some embodiments, a device may include a multi-grain luminescent ceramic in combination with another luminescent material deposited by a different technique, for example, suspended in an binder and disposed over the device, stenciled, or deposited as a thin film or conformal layer, as described above in the background section. In some embodiments, a multi-grain luminescent ceramic may be used with a second ceramic layer that contains no luminescent material.

Multi-grain luminescent ceramics can be textured or molded, ground, machined, hot stamped, or polished into shapes that are desirable, for example, for increased light extraction. For example, a multi-grain luminescent ceramic may be shaped into a lens such as a dome lens or Fresnel lens, roughened, or textured with a photonic crystal structure, such as a periodic lattice of holes formed in the ceramic. The shaped ceramic layer may be smaller than, the same size as, or larger than the surface to which it is attached.

Though the examples herein refer to III-nitride light emitting diodes, it is to be understood that embodiments of the invention may extend to other light emitting devices, including devices of other materials systems such as III-phosphide and III-arsenide, and other structures such as resonant cavity LEDs, laser diodes, and vertical cavity surface emitting lasers.

Figure 5:
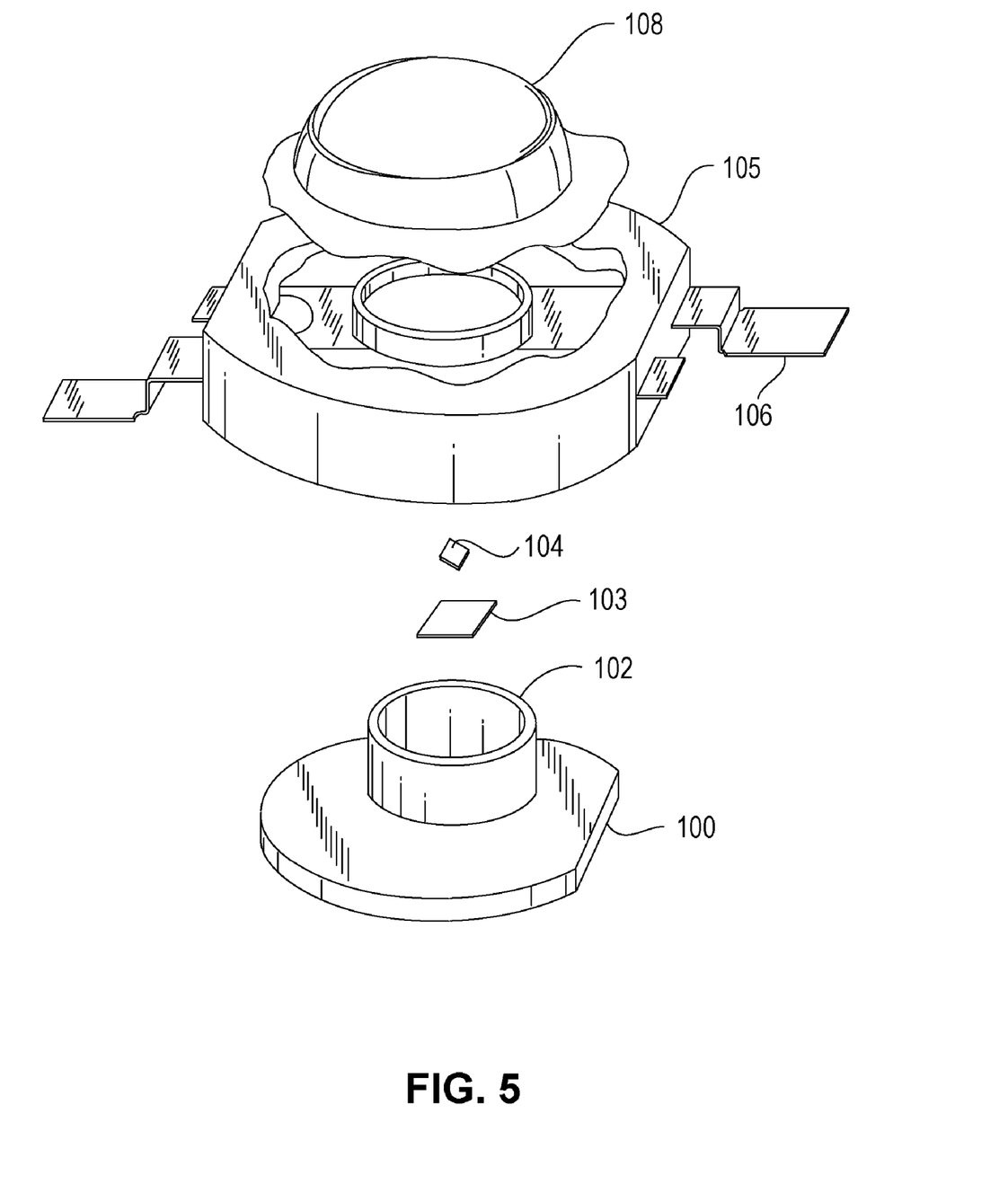
FIG. 5 is an exploded view of a packaged light emitting device.

FIG. 5 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a thermally conducting submount 103 to slug 100. A cover 108, which may be an optical lens, may be added.

EXAMPLE

A multi-grain ceramic is generally formed by preparing a granulate of undoped matrix material, then screening the granulate for granules of the desired size. Separate from the undoped matrix material, a granulate of doped luminescent material is prepared, then screened for granules of the desired size. The granules of undoped matrix material and doped luminescent material are mixed, then formed into green bodies. Any binder present is burned out, then the ceramics are sintered and machined into finished form.

The preparation of a multi-grain cerium doped yttrium aluminum garnet ceramic is described below:

(a) Preparation of non-doped $Y_3Al_5O_{12}$ (YAG) matrix precursor material: 172.82 g $Y_2O_3$ ($d_{50}$=500 nm, 99.99% purity) is mixed with 127.18 g $Al_2O_3$ ($d_{50}$=400 nm, 99.99% purity) and 0.25 g $SiO_2$ (Ludox AS-30) by means of ball milling in isopropanol. After mixing, polyvinyl butyral binder (Sekisui S-LEC) and propylene glycol is added to the slurry that is then dried by evaporation to form a granulate with a granule size in the 100-300 μm range (Precursor I).

(b) Preparation of Ce(III) doped YAG precursor material: 10.000 g $Al_2O_3$, 2.1355 g $Gd_2O_3$ ($d_{50}$=400 nm, 99.99% purity), 11.9907 g $Y_2O_3$ ($d_{50}$=500 nm, 99.99% purity), 0.4040 g $CeO_2$ (99.5% purity) and 195.06 mg hydrolyzed tetraethoxysilane are mixed and granulated as described for (a). A part of the granulate is screened to obtain a 100-300 μm granule fraction (Precursor II), another part of the granulate is screened to obtain a 20-100 μm granule fraction (Precursor III).

(c) Preparation of multiple grain ceramic 1: 11.40 g precursor I is mixed with 1.2725 g precursor II until a statistical mixture is obtained. The mixed granulate is uniaxially pressed into discs and further compacted by cold isostatic pressing at 3500 bar. After burn out of the binder at 1000° C. in air, the ceramics are sintered at 1675° C. for 2 hrs in CO atmosphere. The sintered ceramics are then ground and polished to obtain ceramic wafers with 120 μm thickness and a mass density of 4.54 g/cm³ (99.0% rel. density).

(d) Preparation of multiple grain ceramic 2: 11.40 g precursor I is mixed with 1.2725 g precursor III until a statistical mixture is obtained. The mixed granulate is uniaxially pressed into discs and further compacted by cold isostatic pressing at 3500 bar. After burn out of the binder at 1000° C. in air, the ceramics are sintered at 1675° C. for 2 hrs in CO atmosphere. The sintered ceramics are then ground and polished to obtain ceramic wafers with 120 μm thickness and a mass density of 4.57 g/cm³ (99.7% rel. density).

(e) Preparation of multiple grain ceramic 3: 11.40 g precursor I is mixed with 1.24 g $Y_{2.94}Al_5O_{12}$:$Ce_{0.06}$ phosphor powder with a mean particle size of 12 μm until a statistical mixture is obtained. The mixture is uniaxially pressed into discs and further compacted by cold isostatic pressing at 3500 bar. After burn out of the binder at 1000° C. in air, the ceramics are sintered at 1650° C. for 2 hrs in $H_2/N_2$ (5/95) atmosphere. The sintered ceramics are then grinded and polished to obtain ceramic wafers with 120 μm. After polishing, the ceramic wafers are annealed in air at 1350° C. for 4 hrs.

(f) Preparation of homogeneously doped ceramic 4 (comparative example): 13.5358 g $Y_2O_3$ ($d_{50}$=500 nm, 99.99% purity) is mixed with 10.000 g $Al_2O_3$ ($d_{50}$=400 nm, 99.99% purity), 0.0404 g $CeO_2$ (99.5% purity) and 195.06 mg hydrolyzed tetraethoxysilane by means of ball milling in isopropanol. After mixing, polyvinyl butyral binder (Sekisui S-LEC) and propylene glycol is added to the slurry that is then dried by evaporation to form a granulate with a granule size in the 100-300 μm range.

The presence of regions of doped luminescent material surrounded by undoped material in the luminescent ceramics described in the above examples is confirmed by blue transmission images, which show darker regions where the ceramic is absorbing because the dopant concentration is high, surrounded by lighter regions where the ceramic is undoped. The darker regions on the blue transmission image of ceramic 1 are larger than those on the image of ceramic 2, indicating that the dopant distribution in ceramic 2 is more homogeneous and the doped regions in ceramic 2 are smaller than in ceramic 1, likely due to the smaller granule size of the precursor used for ceramic 2.

The luminescent properties of the samples described above are shown below:

| Sample | Quantum efficiency at 450 nm | x | y |
| --- | --- | --- | --- |
| Ceramic 1 | 0.93 | 0.4072 | 0.5642 |
| Ceramic 2 | 0.94 | 0.4072 | 0.5643 |
| Ceramic 3 | 0.93 | 0.4257 | 0.5515 |
| Ceramic 4 (comparative example) | 0.95 | 0.4071 | 0.565 |

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
a light source; and
a ceramic body disposed in a path of light emitted by the light source, wherein the ceramic body comprises:
a plurality of first grains, each of the first grains comprising a host matrix and an activating dopant configured to absorb first light emitted by the light source and emit second light of a different wavelength from the first light;
a plurality of second grains, each of the second grains comprising the host matrix without any activating dopant,
wherein the first and second grains have a grain size between 0.2 μm and 20 μm, and each of the first grains is surrounded by a ceramic matrix of the second grains.

2. The device of claim 1 wherein the light source comprises a semiconductor structure comprising a light emitting region disposed between an n-type region and a p-type region.

3. The device of claim 2 wherein the ceramic body is configured to scatter light emitted by the light emitting region.

4. The device of claim 2 wherein the second grains are transparent to the first light.

5. The device of claim 1 wherein the activating dopant is Ce.

6. The device of claim 2 wherein the first grains are dispersed over a plurality of regions in the ceramic body, wherein the plurality of regions are separated by second grains.

7. The device of claim 6 wherein:
the first grains comprise a host matrix and an activating dopant; and
within a region of first grains, a first grain proximate a center of the region has a higher concentration of activating dopant than a first grain proximate an edge of the region.

8. The device of claim 2 wherein the ceramic body is disposed on a surface of the semiconductor structure.

9. The device of claim 2 wherein the first light is blue and the second light is yellow or green.

10. The device of claim 2 wherein the first grains are $(Lu_{1-x-y-a-b}Y_xGd_y)_3(Al_{1-z-u}Ga_zSi_u)_5O_{12-u}N_u:Ce_aPr_b$ wherein $0 \leq x \leq 1, 0 \leq y \leq 1, 0 < z \leq 0.1, 0 \leq u \leq 0.2, 0 < a \leq 0.2$ and $0 < b \leq 0.1$.

11. The device of claim 2 wherein the first light is blue and the second light is red.

12. The device of claim 2 wherein the first grains are $(Ca_{1-x-y-z}Sr_xBa_yMg_z)_{1-n}Al_{1+a+b}Si_{1-a-b}N_{3-b}O_b:M_n$ wherein $0 \leq x \leq 1, 0 \leq y \leq 1, 0 \leq z \leq 1, 0 \leq a \leq 1, 0 \leq b \leq 1, 0 \leq n \leq 1, a \leq n$, and M is a metal selected from the group of Ce, Pr, Nd, Sm, Eu, Gd, Tb, Dy, Ho, Er, Tm, Yb, Lu or mixtures thereof.

13. The device of claim 2 wherein the first grains are $Ca(Al,Si)_2N_3$.

14. The device of claim 2 further comprising a wavelength converting material disposed in a path of light emitted by the light emitting region, the wavelength converting material being configured to absorb the first light and emit third light of a different wavelength from the first light.

15. The device of claim 2 further comprising:
first and second contacts electrically connected to the n-type region and the p-type region; and
a cover disposed over the light emitting region.

16. The device of claim 2 wherein the semiconductor structure comprises a plurality of III-nitride semiconductor layers.

17. The device of claim 1 wherein the activating dopant is Eu.

18. The device of claim 14 wherein:
the ceramic body is a first ceramic body; and
the wavelength converting material is included in a second ceramic body.

* * * * *